United States Patent [19]
Hashimoto

[11] Patent Number: 4,914,319
[45] Date of Patent: Apr. 3, 1990

[54] SIGNAL READING CIRCUIT

[75] Inventor: Seiji Hashimoto, Yokohama, Japan

[73] Assignee: Canon Kabushiki Kaisha, Tokyo, Japan

[21] Appl. No.: 183,632

[22] Filed: Apr. 19, 1988

[30] Foreign Application Priority Data

Apr. 30, 1987 [JP] Japan .................... 62-104604

[51] Int. Cl.$^4$ ............ G11C 27/02; H03K 17/16; H03K 17/693
[52] U.S. Cl. .................... 307/353; 307/243; 307/246; 307/572
[58] Field of Search ............ 307/246, 572, 243, 443, 307/247.1, 353; 328/71, 104, 154, 151, 163, 187

[56] References Cited

U.S. PATENT DOCUMENTS 3,427,475 2/1969 Wilkinson et al. .................. 328/154

FOREIGN PATENT DOCUMENTS 0099583 2/1984 European Pat. Off. .
0122081 10/1984 European Pat. Off. .

Primary Examiner—John Zazworsky
Attorney, Agent, or Firm—Fitzpatrick, Cella, Harper & Scinto

[57] ABSTRACT

A signal reading circuit for reading out a signal as a voltage to a signal line through a read transistor and for outputting is provided. This circuit has a selecting circuit to select and output the signal on the signal line after the read transistor was turned on or off.

11 Claims, 4 Drawing Sheets

SIGNAL READING CIRCUIT

BACKGROUND OF THE INVENTION

1. Field of the Invention

The present invention relates to a signal reading circuit for reading out a voltage signal to a signal line through a read transistor and for outputting the signal.

2. Related Background Art

FIG. 1A is a circuit diagram showing an example of a conventional signal reading circuit. FIG. 1B is a timing chart for explaining the operation of such a reading circuit.

In FIG. 1A, by setting a pulse $\phi_t$ to the high level for a predetermined period of time, a transfer transistor $Q_t$ is turned on, so that signals $S_1, S_2, S_3, \ldots$ of sensors (not shown) are transferred to and accumulated in each capacitor $C_t$. In this state, scan pulses $\phi_{11}, \phi_{12}, \ldots$ are successively output from a shift register 102 to sequentially turn on read transistors $Q_s$, thereby reading out the signals $S_1, S_2, S_3, \ldots$, stored in the capacitors $C_t$, to a signal line 101. However, since the signal line 101 has a capacitance $C_h$, the signals which are obtained by dividing the storage signals $S_1, S_2, S_3, \ldots$ by the capacitance of the capacitor $C_t$ and the capacitance $C_h$ are read out to the signal line 101.

As shown in FIG. 1A, pulses $\phi_s, \phi_1,$ and $\phi_2$ are input to the shift register 102. The shift register 102 then outputs a scan pulse, synchronously with the pulse $\phi_1$, by the start pulse $\phi_s$.

The signal read to the signal line 101 is output through an amplifier A. Whenever each signal is output, a reset transistor $Q_r$ is turned on, thereby resetting the signal line 101 to ground potential. The pulse $\phi_2$ which is also input to the shift register 102 is input to a gate electrode of the reset transistor $Q_r$. The circuit elements and sensors shown in FIG. 1A are formed on the same semiconductor substrate.

However, in the conventional example, the noise components caused by the scan pulses $\phi_{11}, \phi_{12}, \ldots$ are added to the signal which is output from the amplifier A. Therefore, when this signal reading circuit is used in e.g., an image pickup apparatus, there is a problem such that those noise components appear as fixed pattern noise. This point will now be explained with reference to a waveform diagram of a signal line voltage $V_0$ shown in FIG. 1B. The signal components are omitted in the waveform $V_0$ for convenience of explanation.

First, for a period of time $T_c$ when the pulse $\phi_2$ is at the high level, the reset transistor $Q_r$ is turned on and the voltage $V_0$ of the signal line 101 is set to ground potential GND. When the pulse $\phi_2$ falls to the low level and the transistor $Q_r$ is turned off, since an overlap capacitance $C_{s2}$ exists, the trailing amount of the pulse $\phi_2$ is capacitively divided by $C_{s2}$ and $C_h$, so that the voltage $V_0$ of the signal line 101 decreases lower than GND by only the level corresponding to the trailing amount (oscillating component b).

However, the amplitude of the oscillating component b is always constant because it depends on the capacitance $C_{s2}$.

Next, when the scan pulse $\phi_{11}$ is input to the transistor $Q_s$ synchronously with the pulse $\phi_1$ (for a period of time $T_t$), since the overlap capacitance $C_s$ of the transistor $Q_s$ exists, the leading amount of the scan pulse $\phi_{11}$ is capacitively divided by $C_s$ and $C_h$, so that the voltage $V_0$ of the signal line 101 increases by only the level of the leading amount (the voltage $V_r$). The trailing amount is also capacitively divided, so that the voltage $V_0$ of the signal line 101 drops by only the level corresponding to the leading amount (voltage $V_t$) (oscillating component a).

In this manner, the sensor signal $S_1$ is read out to the signal line 101 through the read transistor $Q_s$ and output from the amplifier A. Thus, the reset transistor $Q_r$ is again turned on by the pulse $\phi_2$. In a manner similar to the above, the sensor signals $S_2, S_3, \ldots$ are sequentially output.

However, the scan pulses $\phi_{11}, \phi_{12}, \ldots$ which are output synchronously with the pulses $\phi_1$ are input to the gate of individual read transistor $Q_s$, so that the following problems occur.

That is, the overlap capacitances of the read transistors have a certain variation due to a variation in semiconductor processes.

Therefore, the oscillating components a are not uniform. Assuming that a variation of the capacitances $C_s$ is $\Delta C_s$, a variation in oscillating components a is $$\Delta v_n = \Delta C_s V_\phi / (C_s + C_h)$$

When it is now assumed that
$C_h = 5$ pF
$C_s = 0.02$ pF
$\Delta C_s = C_s \times 0.01$
$V_{100} = 5$ V,
the variation $\Delta v_n$ in oscillating components a becomes $\Delta v_n = 0.2$ mV. This variation appears as a fixed pattern noise in the vertical direction on the image and causes the picture quality to deteriorate.

SUMMARY OF THE INVENTION

It is an object of the present invention to provide a signal reading circuit which can solve the foregoing drawbacks in the conventional techniques.

Another object of the invention is to provide a signal reading circuit which can reduce the fixed pattern noises.

To accomplish these objects, according to an embodiment of the present invention, there is provided a signal reading circuit for reading and outputting a signal as a voltage to a signal line through a read transistor, wherein this circuit has selecting means for selecting and outputting the signal on the signal line after the read transistor was opened or closed.

As mentioned above, at the voltage $V_0$ on the signal line shown in FIG. 1B, there is a variation in amplitudes of the oscillating components a due to the read transistors $Q_s$. However, it has been confirmed by the experiments that the change voltage $v_r$ at the leading edge and the change voltage $v_t$ at the trailing edge are almost equal. Thus, the voltage $V_0$ of the signal line 101 before and after the oscillating components a is hardly concerned with the variation in oscillating components a.

Each sensor signal is read out to the signal line 101 by the scan pulse through each read transistor $Q_s$. The signal component remains so long as the signal line 101 is not reset by the reset transistor $Q_r$. That is, the signal component exists on the signal line 101 for the period of time $T_s$ in the diagram.

Therefore, as in the embodiment of the invention, when the signal on the signal line 101 is selected and output after the read transistor $Q_s$ was turned off, the signal can be read out without being influenced by the variation in oscillating components a. Since the amplitudes of the oscillating components b are almost constant, they do not become fixed pattern noises.

The above and other objects and features of the present invention will become apparent from the following detailed description and the appended claims with reference to the accompanying drawings.

DETAILED DESCRIPTION OF THE PREFERRED EMBODIMENTS

An embodiment of the present invention will be described in detail hereinbelow with reference to the drawings.

Figure 2A:
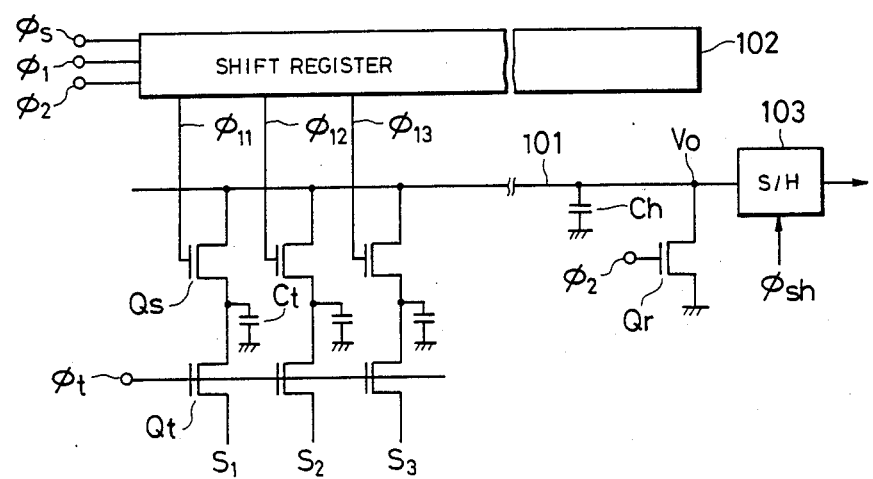
FIG. 2A is a schematic constitutional diagram of the first embodiment of a signal reading circuit according to the invention.
Figure 2B:
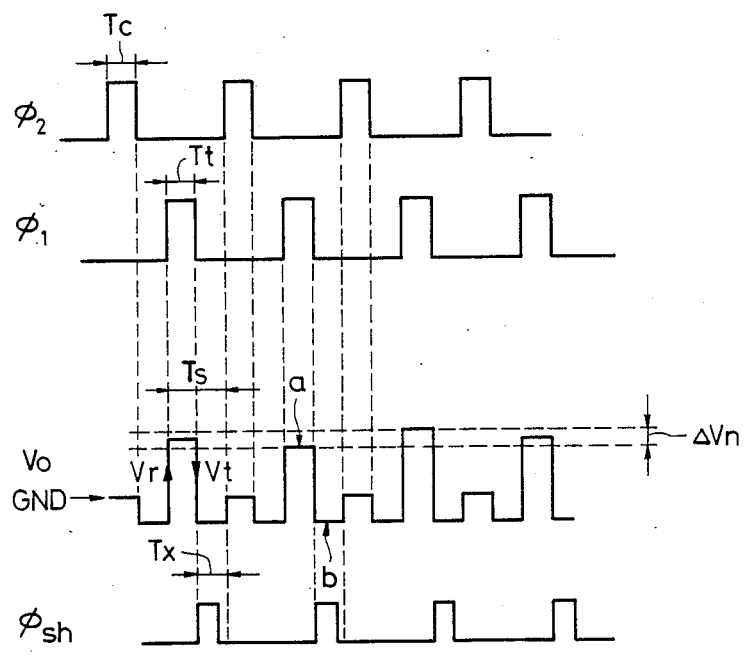
FIG. 2B is a timing chart for explaining the operation of the circuit of FIG. 2A.

FIG. 2A is a schematic constitutional diagram of the first embodiment of a signal reading circuit according to the present invention. FIG. 2B is a timing chart for explaining the operation of this circuit.

Figure 1A:
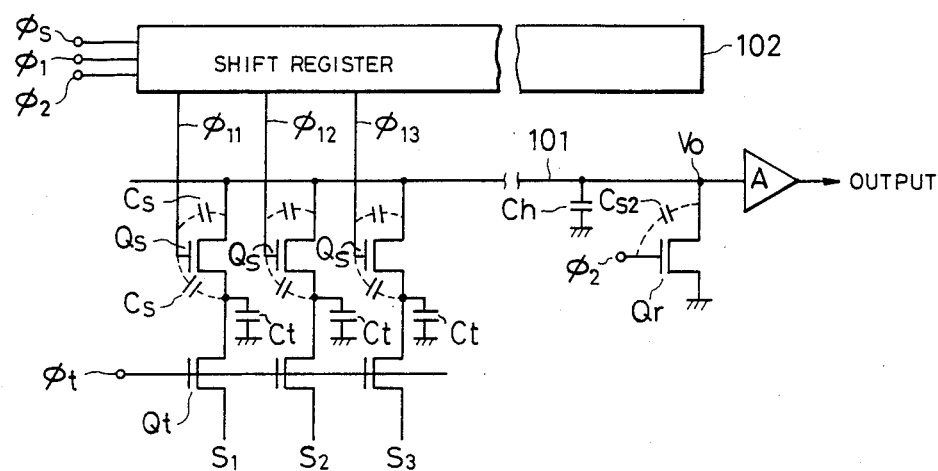
FIG. 1A is a circuit diagram showing an example of a conventional signal reading circuit.
Figure 1B:
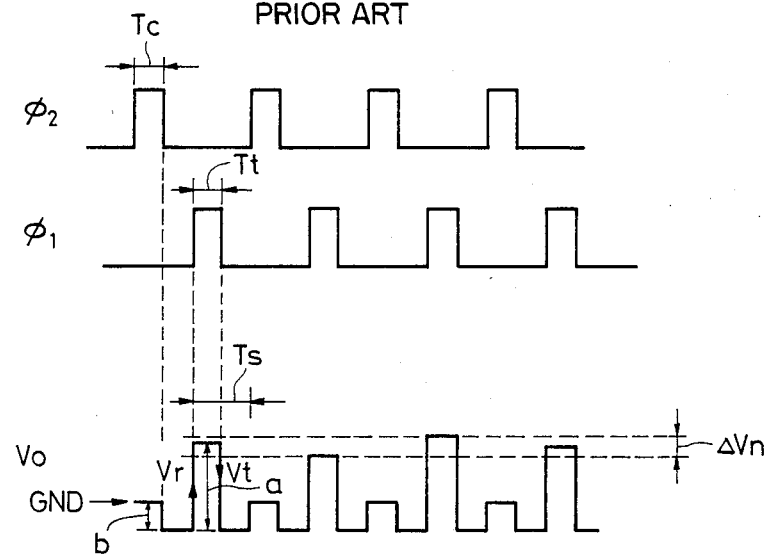
FIG. 1B is a timing chart for explaining the operation of this circuit.

The constitutions of the transfer transistors $Q_t$, accumulating capacitors $C_t$, read transistors $Q_s$, reset transistor $Q_r$, signal line 101, and shift register 102 are as explained in FIG. 1A. The pulses $\phi_1$ and $\phi_2$ and the signal line voltage $V_0$ in FIG. 2B are also as described in FIG. 1B.

In this embodiment, a sample and hold (S/H) circuit 103 is provided as selecting means for the signal line 101 separately from a semiconductor substrate on which the sensors are formed. The signal line voltage $V_0$ after the scan pulse fell to the low level is sampled and held and output. That is, in the period of time $T_s$ in FIG. 2B, a pulse $\phi_{sh}$ is given to the S/H circuit 103 for a period of time $T_x$ before it is reset by the pulse $\phi_2$ after the lapse of the time $T_t$, thereby holding the signal line voltage $V_0$ at that time. Thus, the influence by the fixed pattern noise due to the transistor $Q_s$ can be prevented.

Figure 3A:
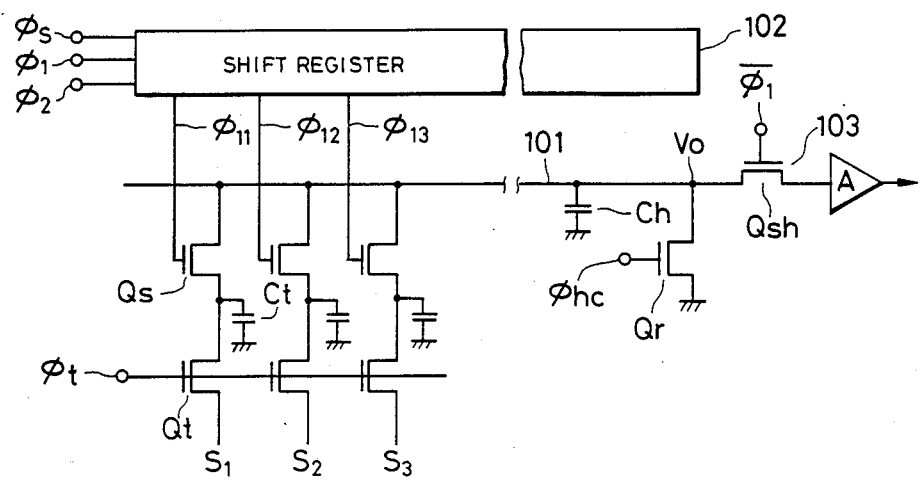
FIG. 3A is a schematic constitutional diagram of the second embodiment of a signal reading circuit according to the invention.
Figure 3B:
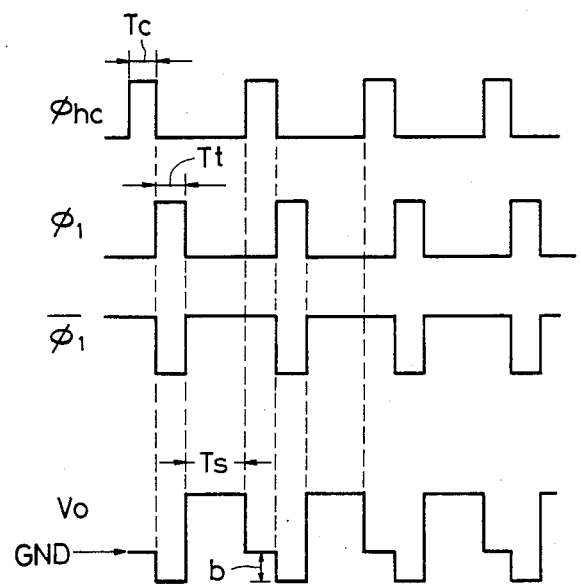
FIG. 3B is a timing chart for explaining the operation of the circuit of FIG. 3A.

FIG. 3A is a schematic constitutional diagram of the second embodiment of a signal reading circuit according to the invention. FIG. 3B is a timing chart for explaining the operation of this circuit. The same parts and components as those in the first embodiment are designated by the same reference numerals.

In this embodiment, the S/H circuit 103 consisting of a transistor $Q_{sh}$ is provided on the same semiconductor substrate as the sensors. An inverted pulse $\overline{\phi_1}$ of a pulse $\phi_1$ is given to a gate electrode of the transistor $Q_{sh}$. By forming the transistor $Q_{sh}$ in the sensor, the structure is simplified and the cost can also be reduced.

First, the reset transistor $Q_r$ is turned on by a pulse $\phi_{hc}$, thereby resetting the signal line 101 to the earth potential GND (for the period of time $T_c$). After the lapse of the period of time $T_c$, the pulse $\phi_{hc}$ falls, so that the signal line voltage $V_0$ decreases to a level lower than the earth potential GND as mentioned above (oscillating component b).

The pulse $\phi_1$ rises in response to the trailing edge of the pulse $\phi_{hc}$. The scan pulse $\phi_{11}$ is input from the shift register 102 to the gate electrode of the transistor $Q_s$ synchronously with the leading edge of the pulse $\phi_1$. Simultaneously, the gate electrode of the transistor $Q_{sh}$ is set to the low level and the transistor $Q_{sh}$ is turned off.

Therefore, the read transistor $Q_s$ is turned on for the period of time $T_t$ and the sensor signal $S_1$ is read out to the signal line 101 and held thereon.

Subsequently, after the expiration of the period of time $T_t$, when the pulse $\phi_1$ trails, the transistor $Q_{sh}$ is turned on. The signal existing on the signal line 101 for the period of time $T_s$ is output through the amplifier A. At this time, the signal line 101 includes no variation in oscillating components a due to the scan pulses $\phi_{11}$ as mentioned above.

Then, after the lapse of the period of time $T_s$, the reset pulse $\phi_{hc}$ rises and the reset transistor $Q_r$ is turned on, thereby resetting the signal line 101. The fixed pattern noise is also eliminated with this structure.

Although the reset transistor $Q_r$ has been used to reset the signal line 101 in the embodiment, another reset transistor may be also provided on an output terminal. On the other hand, in place of the pulse $\overline{\phi_1}$, another pulse having a width narrower than the pulse $\phi_1$ may be also used.

Figure 4:
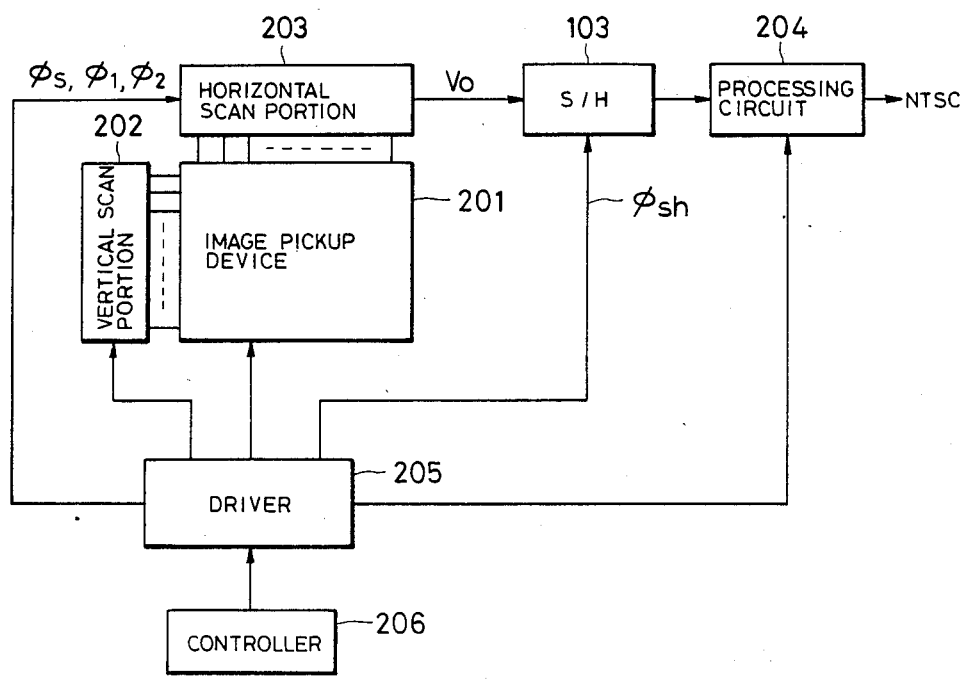
FIG. 4 is a schematic constitutional diagram of an image pickup apparatus using the first embodiment.

FIG. 4 is a schematic constitutional diagram of an image pickup apparatus using the first embodiment.

In the diagram, an image pickup device 201 consisting of photosensors arranged in an array is scanned by a vertical scan portion 202 and a horizontal scan portion 203.

A signal output from the horizontal scan portion 203 is output as a standard television signal through the S/H circuit 103 and a processing circuit 204.

Drive pulses and the like of the vertical scan portion 202 and horizontal scan portion 203 and the pulse $\phi_{sh}$ and the like of the S/H circuit 103 are supplied by a driver 205. The driver 205 is controlled by a controller 206.

The horizontal scan portion 203 comprises: the transfer transistors $Q_t$, capacitors $C_t$, read transistors $Q_s$, reset transistor $Q_r$, signal line 101, shift register 102, and the like in FIG. 2A.

With the horizontal scan portion 203 and S/H circuit 103, the video signal without the fixed pattern noise, as already explained, is obtained and the picture quality can be improved.

As described in detail above, the signal reading circuit according to the invention has a simple structure such that there is provided a selecting means for selecting and outputting the signal on the signal line after the read transistor was turned on or off. Therefore, the signal can be taken out without being influenced by manufacturing variations or the like of the read transistors.

Consequently, when the invention is used in, e.g., an image pickup apparatus, an image of a good quality without the fixed pattern noise can be derived.

I claim:

1. A signal reading apparatus comprising:
   (a) a plurality of signal sources;
   (b) a plurality of accumulating means each of which is provided for each of said signal sources for temporarily holding signals of said plurality of signal lines;

(c) a plurality of switch means each of which is provided for a corresponding one of said accumulating means for reading out the signals stored in the accumulating means, one end of each of said switch means being connected to a corresponding one of said accumulating means;

(d) a capacitive lead connected commonly to another end of each of said plurality of switch means;

(e) control means for selectively making said plurality of switch means operative, and thereby sequentially leading the signals stored in said accumulating means to said capacitive load;

(f) clearing means for clearing the signals led to said capacitive load; and (g) reading means for reading out the signals held in the capacitive load for a period of time until the capacitive load is cleared by said clearing means after each of said switch means was made inoperative by said control means.

2. An apparatus according to claim 1, wherein said plurality of accumulating means includes capacitors.

3. An apparatus according to claim 1, wherein said control means includes a shift register.

4. An apparatus according to claim 1, wherein the timing for selectively making said plurality of switch means operative by said control means and the timing for the operation of said clearing means are synchronized with each other.

5. An apparatus according to claim 1, wherein said reading means includes sampling and holding means.

6. An apparatus according to claim 1, further including a signal output terminal, and wherein said reading means includes switch means arranged between said capacitive load and said signal output terminal.

7. A signal reading apparatus comprising:
(a) a plurality of capacitors for temporarily holding signals;
(b) a plurality of switch means for sequentially leading signals in said plurality of capacitors to a common output signal line; and
(c) reading means for reading out the signal existing on said output signal line for a period of time after a predetermined switching means was made inoperative after leading the signal in a predetermined capacitor to said output signal line by each of said switching means and until another switch means is made operative to clear the signal on said output signal line.

8. An apparatus according to claim 7, wherein said reading means includes sampling and holding means.

9. An apparatus according to claim 7, further including a signal output terminal, and wherein said reading means includes switch means arranged between said output signal line and said signal output terminal.

10. An apparatus according to claim 7, further including a shift register to make said plurality of switch means operative in accordance with a predetermined order.

11. An apparatus according to claim 7, further including clearing means for clearing the signal on said output signal line.

* * * * *

UNITED STATES PATENT AND TRADEMARK OFFICE
CERTIFICATE OF CORRECTION

PATENT NO. : 4,914,319
DATED : April 3, 1990
INVENTOR(S) : Seiji Hashimoto

It is certified that error appears in the above-identified patent and that said Letters Patent is hereby corrected as shown below:

COLUMN 2:

Line 28, "$V_{100}=5V,$" should read --$V\phi=5V,$--.

COLUMN 4:

Line 68, "lines;" should read --sources--.

Signed and Sealed this

Tenth Day of September, 1991

Attest:

HARRY F. MANBECK, JR.

*Attesting Officer*  *Commissioner of Patents and Trademarks*